United States Patent [19]
Finona

[11] Patent Number: 6,083,039
[45] Date of Patent: Jul. 4, 2000

[54] CONNECTOR CONTACT MOLD-POSITIONING

[75] Inventor: Michael Santos Finona, Fountain Valley, Calif.

[73] Assignee: Itt Manufacturing Enterprises, Inc., Wilmington, Del.

[21] Appl. No.: 09/087,697

[22] Filed: Jun. 1, 1998

[51] Int. Cl.⁷ .................................................. H01R 12/24
[52] U.S. Cl. ........................................ 439/493; 439/76.1
[58] Field of Search ................................... 439/76.1, 493, 439/77, 604, 736, 606; 29/841, 848, 855, 856, 858, 883

[56] References Cited

U.S. PATENT DOCUMENTS

| | | | |
|---|---|---|---|
| 3,573,704 | 4/1971 | Tarver | 439/76.1 |
| 3,668,779 | 6/1972 | Turner | 29/629 |
| 3,676,746 | 7/1972 | Kassabgi et al. | 317/101 |
| 3,855,567 | 12/1974 | Harms et al. | 439/593 |
| 3,970,802 | 7/1976 | Nijman | 179/98 |
| 4,519,659 | 5/1985 | Shiino et al. | 439/591 |
| 4,599,588 | 7/1986 | Bell | 335/127 |
| 4,601,530 | 7/1986 | Coldren et al. | 439/460 |
| 4,726,115 | 2/1988 | Hartman | 29/858 |
| 4,871,319 | 10/1989 | Babow | 439/77 |
| 5,194,010 | 3/1993 | Dambach et al. | 439/79 |
| 5,279,030 | 1/1994 | Ito et al. | 29/883 |
| 5,330,365 | 7/1994 | Leeson | 439/77 |
| 5,348,482 | 9/1994 | Rudy, Jr. et al. | 439/61 |
| 5,358,424 | 10/1994 | Bowen et al. | 439/405 |
| 5,415,567 | 5/1995 | Fusselman et al. | 439/344 |
| 5,607,321 | 3/1997 | Schock et al. | 439/460 |
| 5,873,751 | 2/1999 | Daly et al. | 439/620 |
| 5,926,952 | 7/1999 | Ito | 29/883 |
| 5,964,622 | 10/1999 | Ishikawa et al. | 439/606 |
| 6,004,160 | 12/1999 | Korsunsky et al. | 439/660 |

Primary Examiner—Steven L. Stephan
Assistant Examiner—Barry M. L. Standig
Attorney, Agent, or Firm—Thomas L. Peterson

[57] ABSTRACT

Apparatus is provided for connecting the rear termination ends (32, 34) of connector contacts (12, 14) to wires (42, 44) of a cable (40) in a design where the solder connections are encased in molded plastic, which maintains the contacts so their axes (20, 22) extend precisely along forward-rearward directions. This is accomplished by providing a mold with an alignment mold part (110) with holders (114, 120) that either directly engage shoulders (160, 162) of the contacts or that engage shoulders (140, 142) formed on a circuit board (54) with holes (62) that closely receive rear termination ends (32) of a contact.

10 Claims, 4 Drawing Sheets

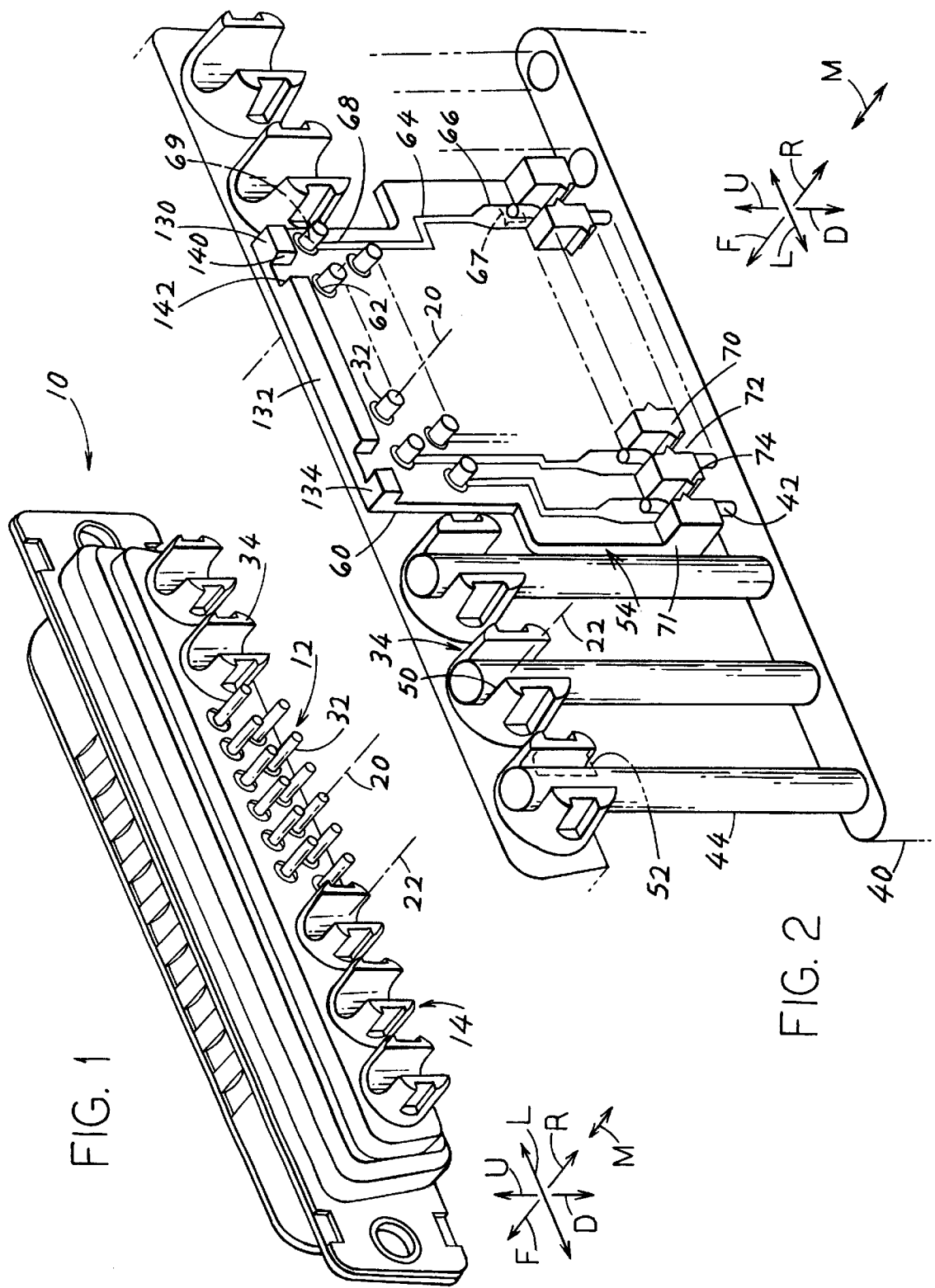

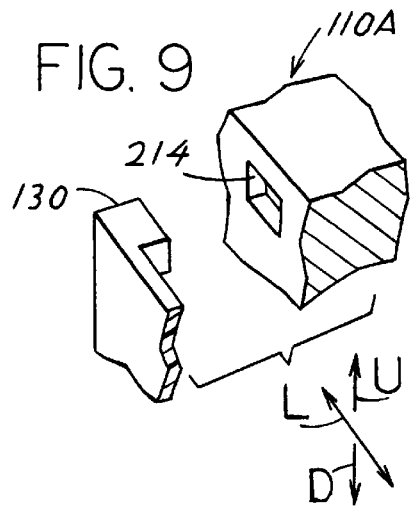
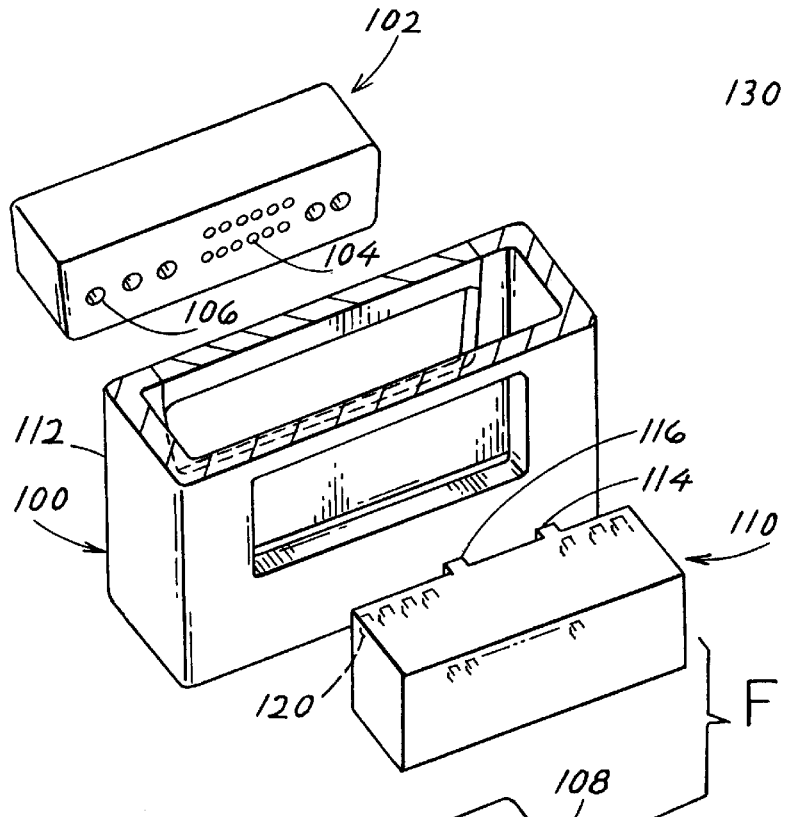
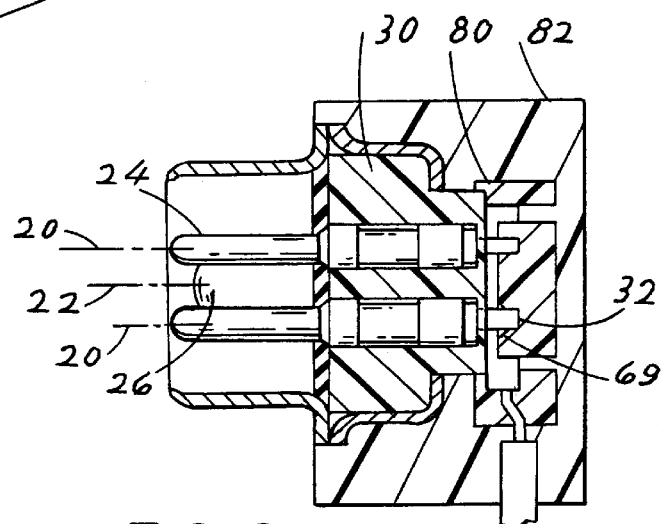

CONNECTOR CONTACT MOLD-POSITIONING

BACKGROUND OF THE INVENTION

A row of contacts of a connector can have their rear termination ends connected to wires of a cable, in solder joints that are enclosed by molded plastic material. During the molding of plastic around the solder joints, the plastic material often moves the rear ends of the contacts in directions perpendicular to their axes. As a result, the contacts are often deflected so their axes do not extend in precise forward-rearward directions, making it difficult to mate the finished connector to another mating connector device. The front ends of the contacts can be positioned by a tool which may have many holes for receiving one or more rows of contacts to position the contacts. However, the spacing between contacts varies due to tolerances required during manufacture, so the tool cannot very closely surround the contact front ends to prevent the contact axes from tilting from a precise forward-rearward direction. A method for molding material around the solder or similar joints at the rear termination ends of the contacts, which avoided tilting of the contacts during molding, in a connection of small front-to-rear depth, would be of value.

SUMMARY OF THE INVENTION

In accordance with one embodiment of the present invention, there is provided a combination of a cable and connector and a method for connecting them with plastic molded about the joints, which avoids tilting of the contact axes from a precise forward-rearward direction. Signal contacts with pin-like rear termination ends are projected through holes in a circuit board lying at the rear of the connector and are soldered thereto. The circuit board has a planer portion that includes the holes and that includes traces extending from the holes to locations where cable wires are soldered to the traces. The circuit board is provided with rearward projections having alignment shoulders facing perpendicular to the contact axis. The mold is provided with an alignment part having circuit board holders that engage the shoulders on the projections, to prevent movement of the circuit board where the contact rear termination ends lie, during the molding operation. The circuit board holders form cavities in the plastic, which is filled during an overmolding operation.

For larger contacts such as power contacts, the rear ends of the power contacts are provided with shoulders that face perpendicular to the contact axes. The alignment mold part is provided with power contact holders that directly engage the shoulders on the rear termination ends of the power contacts, to prevent sideward movement of the power contact rear ends. A front alignment tool holds the front ends of the contacts while the rear ends of the contacts are held either directly by power contact holders or indirectly through circuit board holders that hold the circuit board whose holes closely surround the signal contact termination ends. This prevents sideward movement of the contact rear ends during molding.

The novel features of the invention are set forth with particularity in the appended claims. The invention will be best understood from the following description when read in conjunction with the accompanying drawings.

BRIEF DESCRIPTION OF THE DRAWINGS

FIG. 1 is a rear isometric view of a connector shown prior to termination of the contact rear ends to wires.

FIG. 2 is a rear isometric view showing the rear termination ends of the contacts of FIG. 1 terminated to wires of a cable.

FIG. 7 is an exploded view of a mold that can be used to form the premold material of FIGS. 4 and 5 around the rear of the connector of FIGS. 2 and 3.

FIG. 8 is a more detailed sectional view of a connector with premold and overmold thereon, which is similar to that of FIG. 4.

FIG. 9 is an exploded isometric view of a portion of a circuit board and of an alignment mold part constructed in accordance with another embodiment of the invention.

DESCRIPTION OF THE PREFERRED EMBODIMENTS

Figure 3:
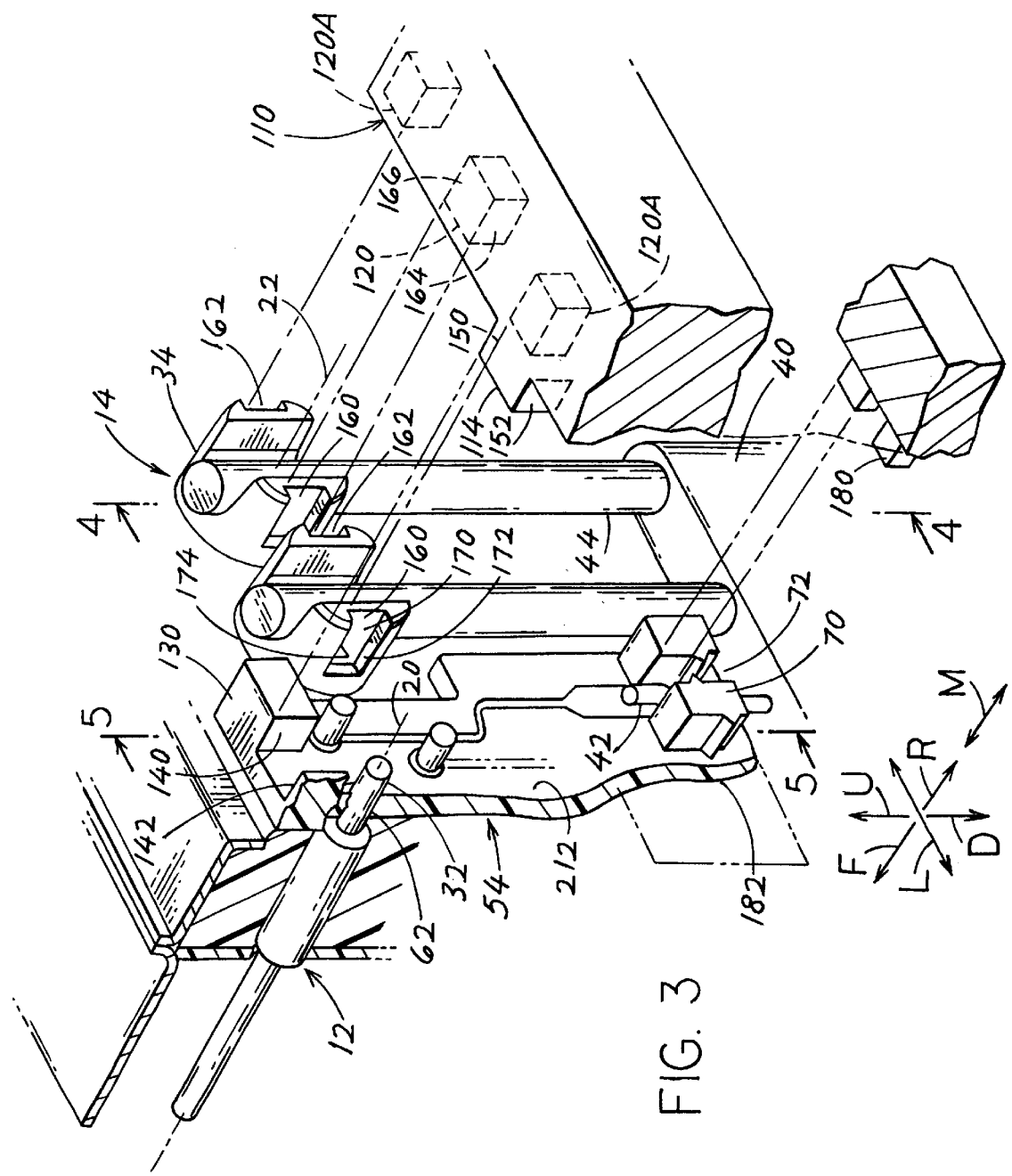
FIG. 3 is a view of a portion of FIG. 1, and also showing details of one of the contacts and showing an alignment mold part that is used to maintain alignment of the contacts during molding of material around the joints.

FIG. 1 illustrates an electrical connector 10 of the D-type, which includes two rows of signal contacts 12 and one interrupted row of power contacts 14. All contacts have axes 20,22 that extend precisely in forward F and rearward R directions, these being longitudinal directions M. The row of contacts extend in lateral directions L, and for the signal contacts there are upper and lower rows spaced in vertical directions U, D. As shown in FIG. 8, each of the signal contacts has a mating front end 24, with pin contacts being shown although socket contacts are also sometimes used. Similarly, each power contact has a mating front end 26. The contacts are held in an insulator 30. Referring again to FIG. 1, it can be seen that each signal contact has a rear termination end 32 and each power contact has a rear termination end 34.

FIG. 2 shows a cable 40 with signal wires 42 and thicker power wires 44 that must be electrically connected, respectively, to the signal contact rear termination ends 32 and to the power contact rear termination ends 34. The power contact termination ends 32 are provided with slots or cutouts 50 that receive the power wires. The power wires are soldered in place as indicated by solder joint 52, although they could be brazed or crimped or joined by other means to form an electrical and mechanical joint. The signal contact termination ends 32 are joined to the signal wires 32 through a circuit board 54. The circuit board has an upper end 60 with two rows of holes 62 that closely (preferably with a clearance of no more than 0.1 mm) receive the signal contact rear ends. The circuit board has numerous traces 64 with lower wire joining ends 66 that join to the signal wires 42, in solder joints thereat, with a solder joint indicated at 67. The traces have upper ends 68 that are joined to the contact rear termination ends by solder joints indicated at 69. Thus the signal contacts are connected through circuit board traces to the signal wires 42 to electrically connect thereto. Applicant constructs the circuit board 54 with a row of rearward projections 70 at its lower end 71, that form strain relief slots 72 that receive and tend to prevent withdrawal of the signal wires. The projections to have protuberances 74 that extend into the slot 72 to provide strain relief.

After the contact rear termination ends and the wires have been electrically connected as shown in FIG. 2, the connections comprising the solder joints, are encapsulated by insulative plastic material which is molded thereabout. FIG. 8 shows a quantity 80 of plastic mold material, which is referred to as premold material, which has been molded around the joints such as 69 where the pin-like signal contact rear ends 32 are joined to traces. FIG. 8 also shows a quantity of overmold material 82 that has been molded around the rear of the connector and around the premold at 80. The premold similarly surrounds the power contacts and the solder joints thereat.

To mold material around the rear termination ends of the contacts, applicant places a mold shown at 100 in FIG. 7 around the combination of connector and cable including the joints where the cable wires are electrically connected (e.g. soldered) to the contact rear ends (directly or through the circuit board traces). A front alignment tool 102 has signal contact holes 104 and power contact holes 106 that receive the mating front ends of the corresponding contacts to position the contacts. However, the holes 104, 106 cannot very closely surround the contact front ends because tolerances are provided for variation in the distance between adjacent contacts. Similarly, the passages in the connector insulator do not very closely surround the contacts. During molding, plastic material is injected at high pressure into the mold, and before it fills the mold it may push the rear ends of the contacts to one side. The large forces may result in the rear ends of the contacts moving to one side, resulting in the axes of the contacts not extending precisely in the front-to-rear directions, but being angled by more than perhaps 2° from the actual front-rear directions in which the connector mates with another connector. Different forces (including plastic shrinkage) may be applied to different contacts, resulting in nonparallel contact axes. A bottom mold part 108 seals around the cable.

To prevent sideward movement of the contact rear ends, applicant provides an alignment mold part 110 that fits in a main mold part 112. The alignment mold part has circuit board holders 114, 116 that prevent movement of the circuit board and therefore of the signal contact rear ends, in a lateral direction L that is perpendicular to the contact axes. The alignment mold part 110 also has power contact holders 120 that prevent lateral or vertical movement of the rear ends of the power contacts.

As shown in FIG. 2, the circuit board includes rearwardly-extending locating projections 130,132, 134 that form locating shoulders such as 140, 142 that face primarily perpendicular to the axes 20 of the signal contacts. FIG. 3 shows that the holder 114 on the alignment mold part 110 has holder shoulders 150, 152 that can lie very closely adjacent to locating shoulders such as 140, 142 on the circuit board projections such as 130. The holders such as 114 on the mold part prevent lateral movement of the circuit board and therefore of the pin-like rear termination ends 32 of the signal contacts, even while high pressure molding material is moving within the mold. The holder 114 can be made with surfaces that abut top and bottom surfaces of the circuit board projection 130 to also prevent upward or down movement of the circuit board and signal contact rear ends, where necessary.

The power contact holders 120 serve to prevent movement of the power contact rear ends 34 in a direction perpendicular to their axes 22. Each power contact rear end is provided with slots 160, 162 that extend in front and rear longitudinal directions M with open rear ends. Each power contact holder 120 has laterally opposite sides 164, 166 that are closely received in the slots 162, 160 of a pair of power contacts. Each endmost power contact holder 120A is received in only one slot 162. The power contact holders 120, 120A prevent lateral L and up and down U, D movement of the rear end of each power contact. This is because each slot forms a laterally-facing surface 170 and upwardly and downwardly facing surfaces 172, 174.

The alignment mold part 110 also has holders 180 that project into the wire-receiving slots 72 that lie between rearward projections 70 at the lower end 182 of the circuit board. The holders 180 prevent sideward movement of the circuit board lower end, which could cause a movement of the board upper end and of the contact rear ends.

Figure 4:
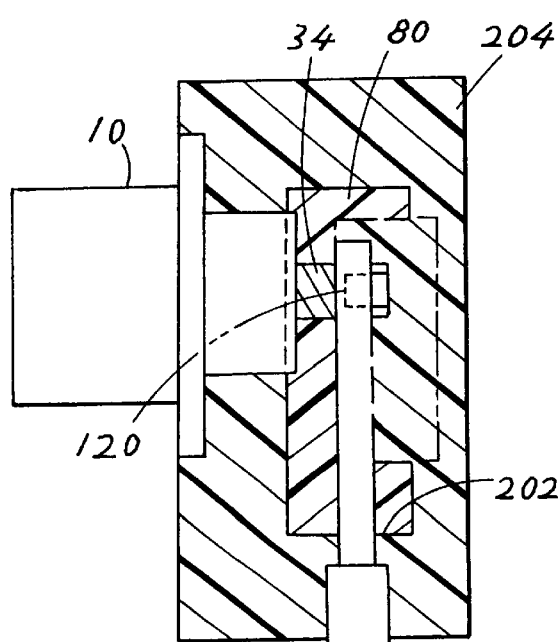
FIG. 4 is a simplified sectional view of the connector of FIG. 3 taken on line 4—4 thereof, but with premold and overmold material molded around the rear of the connector.
Figure 5:
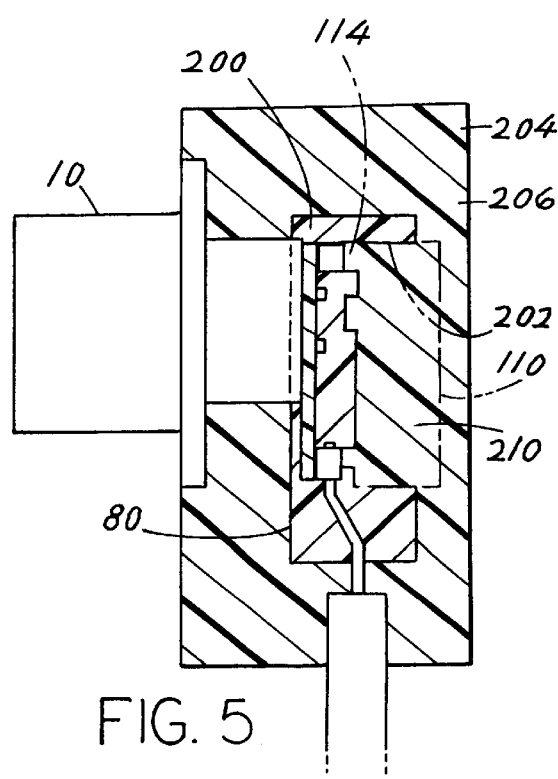
FIG. 5 is a view taken on line 5—5 of FIG. 3, but showing premold and overmold material molded around the rear of the connector.

To mold the plastic material around the solder joints where the cable wires are soldered in place and where the signal contact rear ends are soldered to circuit board traces, applicant first places the connector 10 as shown in FIG. 5, at the front of the mold, with the upper holders 114 of the alignment mold part 110 positioned as shown. A potting material, typically a dielectric plastic material, is injected into the mold to form a preform at 200 that includes the quantity 80 of premold material. The premold material 80 surrounds the solder joints, but leaves a cavity at 202 where the alignment mold part 110 lies. Thereafter, another mold, called an overmold, is placed around the connector and around the premold, and a quantity 204 of molding material is injected into that mold to leave an overmold 206. The material of the overmold includes an overmold part 210 that fills the cavity 202. FIG. 4 shows the cavity at 202, at a cross section that indicates the power contact holders 120.

Figure 6:
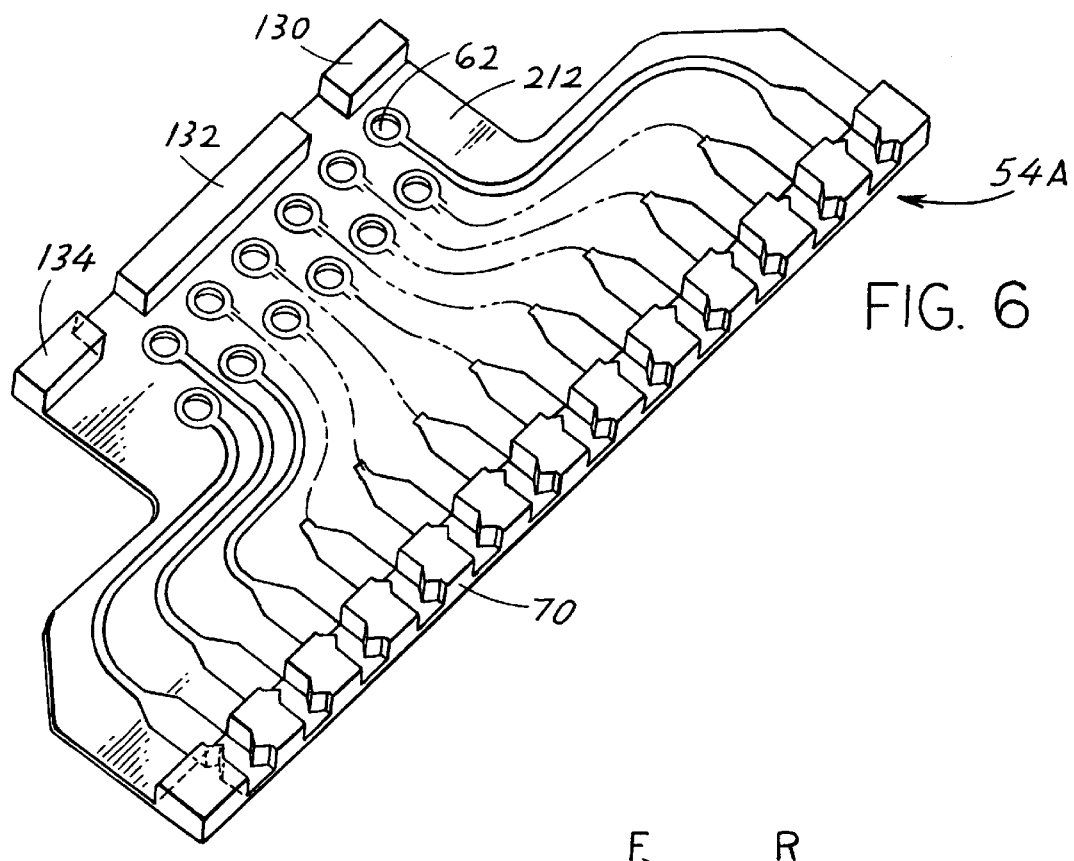
FIG. 6 is an isometric view of a circuit board of a type that can be used in the connector of FIGS. 1–5.

FIG. 6 shows a modified circuit board 54A whose lower portion is wide but which is otherwise similar to that 54 of FIGS. 1–5. Each circuit board can be formed from a thick sheet of material with dielectric material (e.g. epoxy) cut away by milling. However, applicant prefers to mold the circuit board to form the projections 130,132, 134, and 70. By forming the projections integral with the planer portion 212 of the board, applicant is able to precisely locate the pin-receiving holes 62 with respect to the projections and their locating shoulders, in a low-cost manner.

FIG. 9 shows a modified alignment mold part 110A with a holder 214 formed by a recess that closely receives the projection 130 to prevent it from moving laterally L or up U or down D, which are directions perpendicular to the axes of the signal contacts.

While terms such as "up" "down" etc. have been used to aid in describing the invention as illustrated, it should be understood that the connector and its parts can be used in any orientation with respect to the Earth.

Thus, the invention provides a method for electrically connecting rear termination ends of connector contacts to wires and for encapsulating solder or similar joints in molding material, and provides the combination of a connector and wires resulting from such method, which avoids tilting of the contact axes during the molding process. Some of the contacts such as the signal contact are held in place by having been projected through holes in a circuit board that closely surround the contact rear ends and are soldered thereto, and by the use of an alignment mold part that engages locating shoulders on the circuit board to prevent movement in at least one pair of opposite directions that are primarily perpendicular to the axis of the contact. The circuit board can be formed with rearward projections that form such locating shoulders. Power contacts can be held in alignment by forming them with alignment shoulders, which may lie within slots within the rear of the contact, and by forming an alignment mold part with holders that directly engage the contact shoulders as by entering the slots.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A connection arrangement comprising:

a connector with a rear end, which includes a connector insulator having at least one laterally-extending row of passages, said connector including at least one row of contacts extending through said passages with each contact having a front mating end, a pin-shaped rear termination end that projects rearwardly from the corresponding passage, and a contact axis that extends in front and rear directions;

a circuit board coupled to said connector rear end, said circuit board having an upper end with a row of pin-receiving holes that receive said pin-shaped termination ends, a lower end with a row of wire-receiving locations, and a plurality of conductive traces lying on said circuit board with each trace extending from one of said holes to one of said wire-receiving locations;

said rear termination ends of said contacts each projecting through one of said pin-receiving holes and joined to one of said traces thereat, and a plurality of wires of a cable each lying at one of said wire-receiving locations and joined to one of said traces thereat;

a quantity of mold material which is nonintegral with said circuit board and which is molded around at least a rear portion of said circuit board and said traces, with said portion of said circuit board including trace locations where said traces are joined to said contact pin-shaped rear termination ends and where said contacts are joined to said wires with said mold material intimately molded around portions of said contact rear termination ends.

2. The combination described in claim 1 including:

a quantity of overmolding material surrounding said mold material;

said circuit board has a plurality of locating projections forming locating shoulder facing primarily perpendicular to said gassage axes:

said overmolding material lies against said shoulders.

3. The combination described in claim 1 wherein:

said circuit board has a planar portion that lies in a vertical plane and has at least one projection that projects rearwardly from said planar portion and that forms one of said locating shoulders.

4. The combination described in claim 1 wherein:

said circuit board has a planar portion that lies in a first plane and a lower end with a plurality of laterally-spaced strain-relief projections that project rearwardly from said planar portion, with said strain-relief projections forming wire-receiving slots between themselves and having strain-relief protuberances projecting into said slots;

said strain-relief protuberances being integrally molded with said planar portion.

5. A connection arrangement that includes a wire and a connector wherein the connector includes a connector insulator having at least one passage and the connector also includes at least one contact extending through said passage with said contact having a front mating end and a rear termination end that projects rearwardly from the corresponding passage and that has a contact axis, wherein said termination end has a wire-receiving slot and said wire has an end lying in said slot and joined in a joint thereat to said termination end, comprising:

a quantity of mold material lying intimately around said joint where said wire end is joined to said rear termination end;

said rear termination end of said contact having a plurality of locating shoulders facing primarily perpendicular to said passage axis, with said quantity of mold material having at least one cavity extending to said shoulder to enable the passage of an alignment mold part holder during molding of said quantity of mold material.

6. The combination described in claim 5 wherein:

a quantity of overmolding material lying around said mold material, said overmolding material lying in said cavity.

7. Apparatus for use with a connector that has an insulator with a plurality of passages and with a plurality of contacts lying in said passages and having pin-shaped rear termination ends projecting from said passages, where said contacts have parallel axes extending in forward and rearward directions, to connect said termination ends to wires, comprising:

a circuit board having a planar portion with a plurality of holes of a size to closely receive said pin-like rear termination ends, said circuit board having a plurality of electrically conductive traces that each has a first trace end lying around one of said holes for soldering to one of said termination ends and that each has a wire terminating trace end for connection to one of said wires;

said circuit board having a rearwardly-projecting first locating projection that projects from said planar portion and that is rigidly fixed to said planar portion, with said projection forming a pair of shoulders facing primarily perpendicular to said axes, to enable holding of said termination ends against movement perpendicular to said axes by holding of said shoulders.

8. The apparatus described in claim 7 wherein:

said circuit board has upper and lower ends, and a planar portion extending therebetween, with holes and said first locating projections lying at said circuit board upper end, and said circuit board has rearwardly-projecting second strain relief projections at said circuit board lower end, with said first and second projections being molded integral with said planar portion.

9. A method for use with a connector having a plurality of contacts with parallel axes that extend in front and rear longitudinal directions, where each contact has a rear termination end that is electrically connected to an end of a wire, for molding material around at least part of said contact rear termination end and around said cable wire, comprising:

placing a mold around said contact rear termination ends and said cable wire ends, and injecting a mold material into said cavity, including holding said rear termination ends against movement in at least one direction that is perpendicular to said axes while injecting said mold material;

said connector includes a circuit board that has a plurality of holes, and said rear termination ends extend closely through said holes, with said circuit board having electrically conductive traces with first trace ends lyinq at said holes and joined to said rear termination ends and with second trace ends connected to said wires;

said circuit board has a plurality of rearward projections that form board shoulders that face perpendicular to said axes, and said step of holding said rear termination ends includes inserting holding parts of an alignment mold part of said mold, that have projections to engage said board shoulders, to prevent movement of said projections relative to said mold, while preventing movement of said mold relative to said connector.

10. A method for use with a connector having a plurality of contacts with parallel axes that extend in front and rear longitudinal directions, where each contact has a rear termination end that is electrically connected to an end of a wire, for moldina material around at least part of said contact rear termination end and around said cable wire, comprising:

placing a mold around said contact rear termination ends and said cable wire ends, and injecting a mold material into said cavity, including holding said rear termination ends against movement in at least one direction that is perpendicular to said axes while injecting said mold material;

forming each of said contact rear termination ends with a pair of shoulders that face in opposite directions that are both perpendicular to said axes, said step of holding said rear termination ends includes inserting a holder with holder surfaces into the cavity of said mold, so said holder surfaces engage the pair of shoulders of each of said contacts to prevent their movement in either of said opposite directions.

* * * * *